United States Patent
Myers (10) Patent No.: US 8,049,487 B2
(45) Date of Patent: Nov. 1, 2011

(54) POWER MEASUREMENT CIRCUIT

(75) Inventor: John P. Myers, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 185 days.

(21) Appl. No.: 12/338,235

(22) Filed: Dec. 18, 2008

(65) Prior Publication Data

US 2010/0127755 A1    May 27, 2010

Related U.S. Application Data

(63) Continuation-in-part of application No. 12/277,811, filed on Nov. 25, 2008, now abandoned.

(51) Int. Cl.
  *G01R 23/04* (2006.01)
  *H02M 7/00* (2006.01)
(52) U.S. Cl. .......................... 324/95; 327/532
(58) Field of Classification Search ............... 324/95; 327/530–533
  See application file for complete search history.

(56) References Cited

U.S. PATENT DOCUMENTS

| | | | |
|---|---|---|---|
| 4,639,623 A | 1/1987 | Pullen, Jr. | |
| 6,172,549 B1 | 1/2001 | Gilbert | |
| 6,452,450 B1 * | 9/2002 | Enriquez | 330/257 |
| 6,525,601 B2 * | 2/2003 | Gilbert | 327/560 |
| 6,922,086 B2 * | 7/2005 | Gist | 327/78 |
| 7,002,394 B1 | 2/2006 | Gilbert | |
| 7,804,364 B2 * | 9/2010 | Dupuis et al. | 330/297 |
| 2008/0136491 A1 | 6/2008 | Zou | |

OTHER PUBLICATIONS

Non-Final Office Action dated Jul. 20, 2010 issued in corresponding U.S. Appl. No. 12/277,811.

* cited by examiner

*Primary Examiner* — Huy Q Phan
*Assistant Examiner* — Joshua Benitez
(74) *Attorney, Agent, or Firm* — McDermott Will & Emery LLP (57) ABSTRACT

A power measurement circuit and method are described. The circuit comprises: a transconductance rectifier arrangement including an input and configured to receive a periodically varying input voltage signal having an approximate 50% duty cycle; and an averaging filter for producing a time averaged DC output signal proportional to the mean square of the voltage at the input of the transconductance rectifier arrangement and representative of the average power of the input voltage signal within a range of voltages at the input.

19 Claims, 9 Drawing Sheets

POWER MEASUREMENT CIRCUIT

RELATED APPLICATION

This application is a continuation-in-part of U.S. application Ser. No. 12/277,811 filed on Nov. 25, 2008.

FIELD

The application describes an average power measurement circuit, and more particularly a circuit constructed to provide a signal representing the average power provided at its input.

BACKGROUND

In signal processing it is often desirable and sometimes even necessary to provide an indication of signal power. For example, in high frequency RF wireless applications the RF carrier can be envelope modulated with a signal having a high crest factor; and under these and similar circumstances, it may be desirable to provide an indication of the average power provided by this signal. One technique is to apply the signal to a power measurement circuit which is designed to provide a signal representing the square of the input as an indication of its average power, which is an accurate measure regardless of the signal's crest factor. Such an approach is described in U.S. Published Application No. 2008/0136491 dated Jun. 12, 2008, based upon an application filed on Dec. 6, 2006 in the name of Min Z. Zou, and assigned to the present assignee, wherein a squaring cell ($x^2$) is coupled to an averaging RC filter in order to provide an average power measurement of the input signal. Other circuit power measurement implementations are shown and described in U.S. Pat. No. 4,639,623 issued to Pullen on Jan. 27, 1987, and U.S. Pat. No. 6,172,549 issued to Gilbert on Jan. 9, 2001 (the "Gilbert Patent").

In some RF applications, RF signals routed on a circuit board are single-ended, and must interface with the differential input of a power measurement circuit through an interface in the form of a balun transformer, which increases the cost and complexity of the circuit. It is desirable to provide a power measurement circuit which is provided with a single-ended input eliminating the need for a balun transformer.

SUMMARY

A power measurement circuit comprises: a transconductance rectifier arrangement including an input and configured to receive a periodically varying input voltage signal having an approximate 50% duty cycle; and an averaging filter for producing a time averaged DC output signal proportional to the mean square of the voltage at the input of the transconductance rectifier arrangement and representative of the average power of the input voltage signal within a range of voltages at the input. The best results are achieved for applications where the input voltage has a 50% duty cycle, although it should be appreciated that for certain applications the duty cycle can vary from 50% where less accurate results are acceptable. Accordingly, the term "approximate 50% duty cycle" is intended to include all such applications.

A method of measuring power with a circuit comprising a transconductance rectifier arrangement including an input and configured to receive a periodically varying input voltage signal having an approximate 50% duty cycle, comprising: producing a time averaged DC output signal proportional to the mean square of the voltage at the input of the transconductance rectifier arrangement and representative of the average power of the input voltage signal within a range of voltages at the input.

DETAILED DESCRIPTION OF THE DRAWINGS

Figure 1:
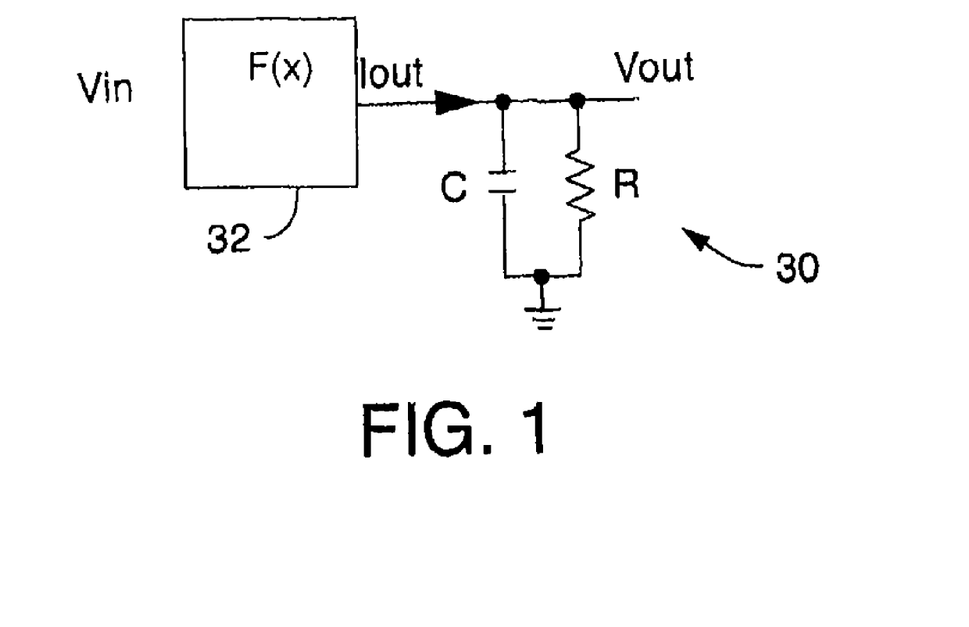
FIG. 1 shows a general diagram, partially in block form and partially in schematic form, of the power measurement circuit described herein.

In the drawings, FIG. 1 shows a general block diagram of the preferred embodiment of the power measurement circuit 30. As shown an input voltage Vin is applied to the input of a transconductance rectifier arrangement 32 having a special transconductance rectifier function F(x). The output of arrangement 32 is applied in turn to the input of an averaging filter 34 for producing a time averaged DC output signal proportional to the mean square of the voltage Vin at the input of the arrangement 32.

Figure 2:
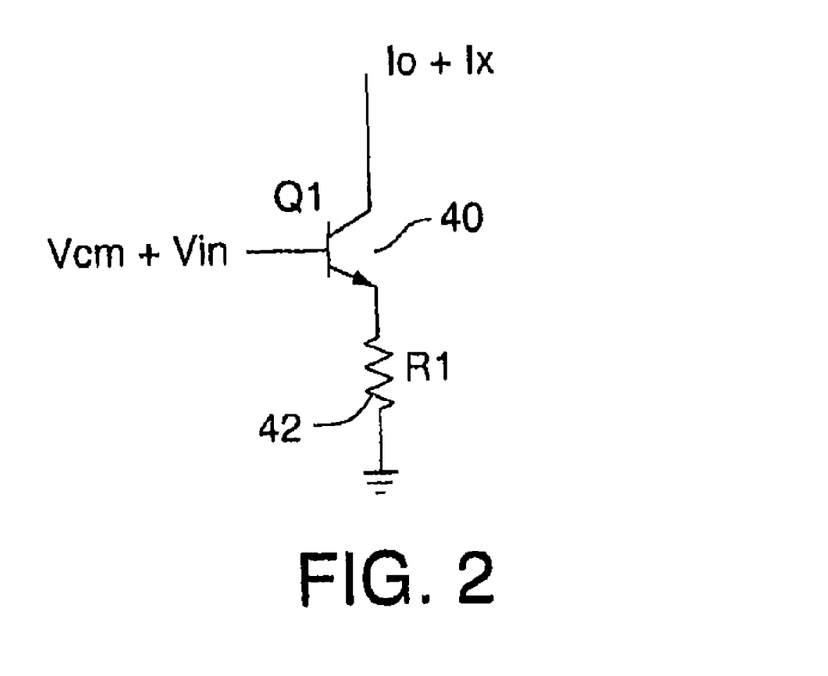
FIG. 2 is a schematic diagram of a basic transconductance rectifier.

The transconductance rectifier arrangement can take many forms with one being shown in FIG. 2. In FIG. 2, the transistor 40 receives a bias current $I_o$ and provides a rectified current $I_x$ as a function of the input sinusoidal voltage $V_{in}$ applied to the base of the transistor (where $V_{cm}$ is a bias voltage). This results in current flowing through the resistor 42 coupled between the emitter of the transistor 40 and system ground. This arrangement provides a single-ended transconductance rectifier circuit that eliminates the need for an external balun transformer. When the collector of transistor 40 is coupled to an averaging filter (not shown in FIG. 2), the resulting circuit produces a voltage at the filter output which is proportional to the average power of the input sinusoidal signal $V_{in}$. The relationship is further understood from the following:

If $I_{C40} \cdot R_{42} \ll V_T$, $$I_{C50} = I_S \cdot e^{(Vcm+Vin)/V_T} = I_o \cdot e^{Vin/V_T} \quad (1)$$

wherein:

$I_{c50}$ is the collector current through transistor 40 (amps);
$R_{42}$ is the emitter degeneration resistance (ohms);
$V_T$ is thermal voltage for the transistor (volts);
$I_S$ is the reverse saturation current of the base—emitter diode of the transistor (amps);
$V_{in}$ is the input signal voltage at the base of the transistor 50 (volts); and
$V_{cm}$ is the bias voltage applied at the base of transistor 50 (volts)

If it is assumed that $V_{in}$ is periodic and time symmetric with 50% duty cycle, such as a modulated sinusoidal RF carrier, then the amplitude of the carrier is practically the same one-half cycle later, given that the bandwidth of the modulation is small compared to the carrier frequency $\omega_c$.

$$Vin(\omega_c t) \propto \sin(\omega_c t + \pi) \approx -\sin(\omega_c t) \quad (2)$$

Then $I_{OUT}$ for one half cycle can be written:

$$I_{OUT} = \frac{1}{2} \cdot Io \cdot \left\{ 1 + \frac{Vin}{Vt} + \frac{1}{2} \cdot \left(\frac{Vin}{Vt}\right)^2 + \frac{1}{6} \cdot \left(\frac{Vin}{Vt}\right)^3 + \frac{1}{24} \cdot \left(\frac{Vin}{Vt}\right)^4 + \text{(Higher order terms)} \right\} \quad (3)$$

And $I_{OUT}$ for the next half cycle can be written:

$$I_{OUT} = \frac{1}{2} \cdot Io \cdot \left\{ 1 - \frac{Vin}{Vt} + \frac{1}{2} \cdot \left(\frac{Vin}{Vt}\right)^2 - \frac{1}{6} \cdot \left(\frac{Vin}{Vt}\right)^3 + \frac{1}{24} \cdot \left(\frac{Vin}{Vt}\right)^4 + \text{(Higher order terms)} \right\} \quad (4)$$

wherein $I_{OUT}$ is the rectified output current

Integrating these currents across one cycle, the odd order terms cancel, leaving the following:

$$I_{OUT} = Io \cdot \left\{ 1 + \frac{1}{2} \cdot \left(\frac{Vin}{Vt}\right)^2 + \frac{1}{24} \cdot \left(\frac{Vin}{Vt}\right)^4 + \text{(Higher order terms)} \right\} \quad (5)$$

$$I_{OUT} = Io + Ix \quad (6)$$

$$Ix \approx \frac{1}{2} \cdot Io \cdot \left(\frac{Vin}{Vt}\right)^2, \quad (7)$$

and if $I_{C1} \cdot R1 \gg V_T$, $Ix \approx \frac{Vin}{R1}$

Figure 3:
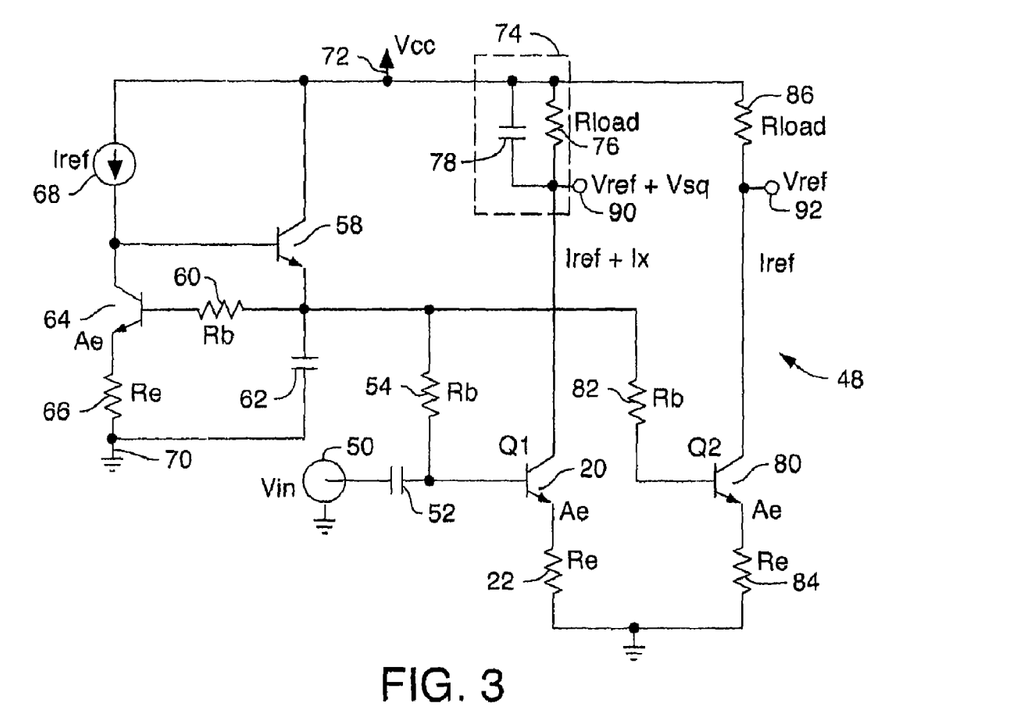
FIG. 3 is a schematic diagram of one embodiment of the transconductance rectifier arrangement.

A specific implementation of FIG. 1 using the rectifier of FIG. 2 is shown in FIG. 3. As shown, the sinusoidal voltage input $V_{in}$ is applied to the input 50 of the circuit shown at 48. The input 50 is applied through capacitor 52 to the base of transistor 20 so that capacitor 52 will block any DC component of the input voltage applied to the transistor base. The base of transistor 20 is also connected to resistor 54, which in turn is applied to the junction of the emitter of transistor 58, resistor 60, and the capacitor 62. The opposite end of resistor 60 is connected to the base of transistor 64, with the emitter of transistor 64 being connected in turn to resistor 66, while the collector of transistor 64 is connected to current source 68. The other plate of capacitor 62 and other end of resistor 66 are connected together and to system ground shown at 70, while the collector of transistor 58 and the current source 68 are both connected to the supply voltage Vcc input shown at 72. The base of transistor 58 is connected to the collector of transistor 64. Transistor 20 has its emitter connected through resistor 22 to system ground, while its collector is connected to the averaging filter 74. Averaging filter 74 includes a load resistor 76 and capacitor 78 connected in parallel with one another between the collector of transistor 20 and the supply voltage input 72. A second transistor shown at 80 has its base connected through resistor 82 to the junction formed between the emitter of transistor 58, resistor 54 and capacitor 62. The emitter of transistor 80 is connected through resistor 84 to system ground, while the collector is connected through load resistor 86 to the supply voltage input 72. The circuit provides a differential output. i.e., the output of the circuit includes one output 90 provided at the junction of the load resistor 76 of the averaging filter 74 and the collector of transistor 20, and a second output 92 provided at the junction between the load resistor 86 and the collector of transistor 80. Thus, the output of the circuit is the difference between the signal levels at the two outputs 90 and 92.

In the embodiment described, transistors 58 and 64 are connected form a current mirror. If transistors 64, 20 and 80 are identical and have the same emitter area, and the values of each of the resistors 66, 22 and 84 are the same, with the application of the supply voltage Vcc an identical reference or bias current Iref will flow in the collectors of each of the transistors 64, 20 and 80. A DC bias current will also flow through for the resistors 60, 54 and 86, and if all of these resistors are of the same value, the DC bias voltage generated across each of these resistors will be the same. The resistor 54, and AC decoupling capacitor 62 present the input at 50 with a controlled termination impedance equal to the resistance value of resistor 54 measured in ohms. Specifically, the circuit produces a differential output signal directly proportional to the real input signal power delivered to resistor 54. It should be appreciated that the reference currents flowing in the collectors of transistors 64, 20 and 80 can be scaled relative to one another by scaling the emitter areas of the transistors 58, 64, 20 and 80 and/or scaling the values of resistors 66, 22 and 84. Similarly, the DC bias voltage applied across the resistors 60, 54 and 86 can also be scaled by scaling the values of the resistors. Of importance, the DC bias voltages should be set to insure that the entire sinusoidal signal applied at the input will always be processed as a single polarity signal throughout its entire cycle to ensure it is properly rectified by the transistor 20. It should also be noted that the presence of transistor 58 is part of a feed-back loop formed with transistor 64 and resistor 60, the function of which is to keep the dc-bias voltage $V_{cm}$ appearing at the rectifier (transistor 20) stable and controlled over process and temperature variation.

The averaging filter 74 time averages the sinusoidal voltage applied across the filter. In one embodiment resistors 76 and 86 are preferably of equal value, resistors 22 and 84 are of equal value and the transistors 20 and 60 are identical with the same emitter areas, so that Iref though one leg of the circuit formed by transistor 20 and resistors 22 and 76 will be identical to the Iref flowing through the leg of the circuit formed by transistor 80 and resistors 84 and 86. Similarly, the voltage Vref across each of the resistors 76 and 86 will be identical. The current though resistor 86 will only be this reference current. However, because of the presence of the capacitor 78 of the filter 74, the current Ix will also be generated so as to create additional voltage Vsq across each of the filter elements representing the mean-square of the input voltage. Thus, by comparing the difference between the two voltages at the outputs 90 and 92, the Vref component of each is canceled leaving a signal representing Vsq. Finally, it should be noted that transistor 80 provided in the part of the circuit arrangement created by the resistors 84 and 86 also compensates for temperature and process variations.

Figure 4:
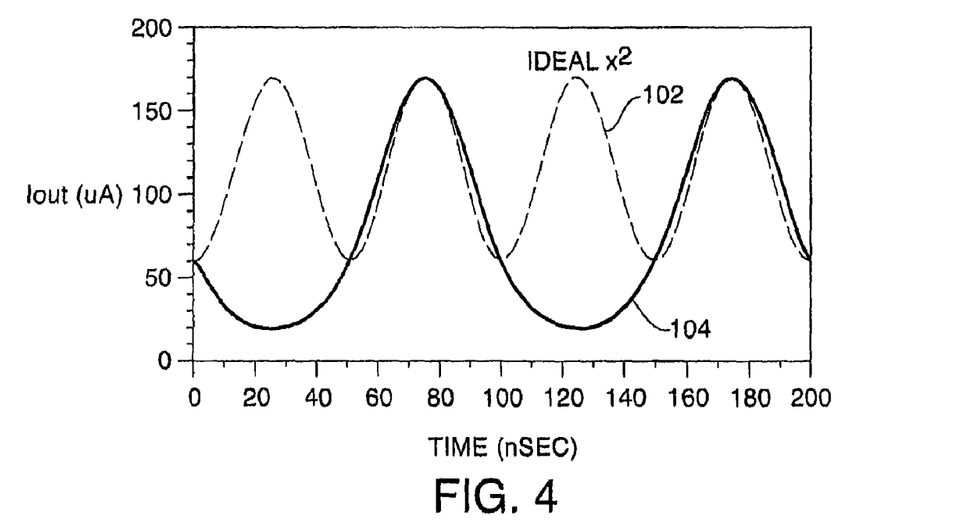
FIG. 4 is a graphical illustration of the output current of a transconductance rectifier for a 10 MHz Sinusoidal Input.

FIG. 4 is a graphical illustration showing an example of an output current waveform 100 of the transconductance amplifier in response to a 10 MHz sinusoidal input signal compared to the ideal square waveform of the input voltage 102. It is important to note that although the output current waveform 104 does not look like the square of the input voltage, once it is time averaged by across the output filter (e.g., filter 74 in FIG. 3), the result is a DC voltage proportional to the average of the square of the input signal voltage.

Figure 5:
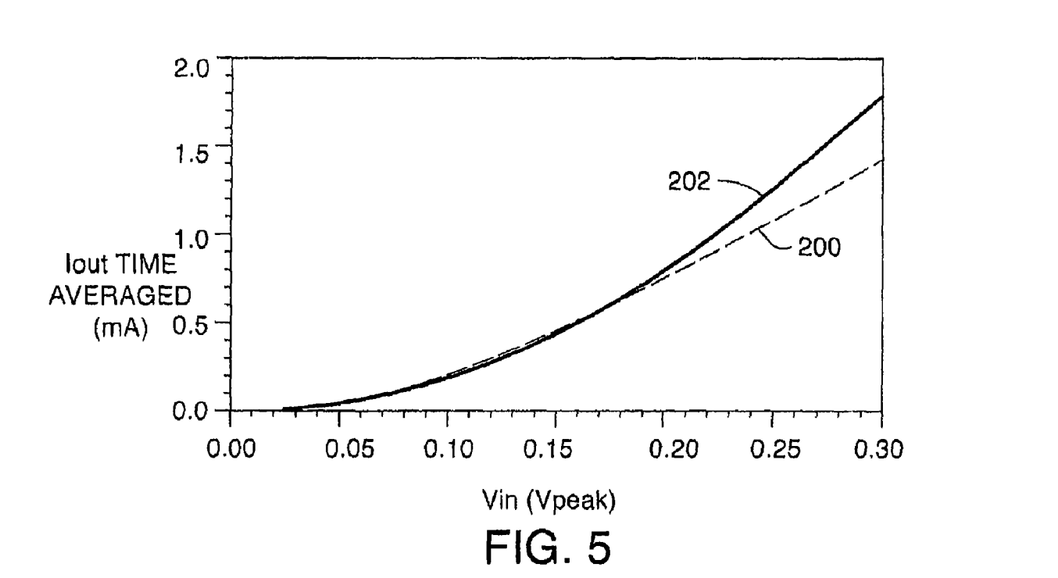
FIG. 5 is a graphical illustration of a time averaged output current vs. input sinusoidal amplitude.
Figure 6:
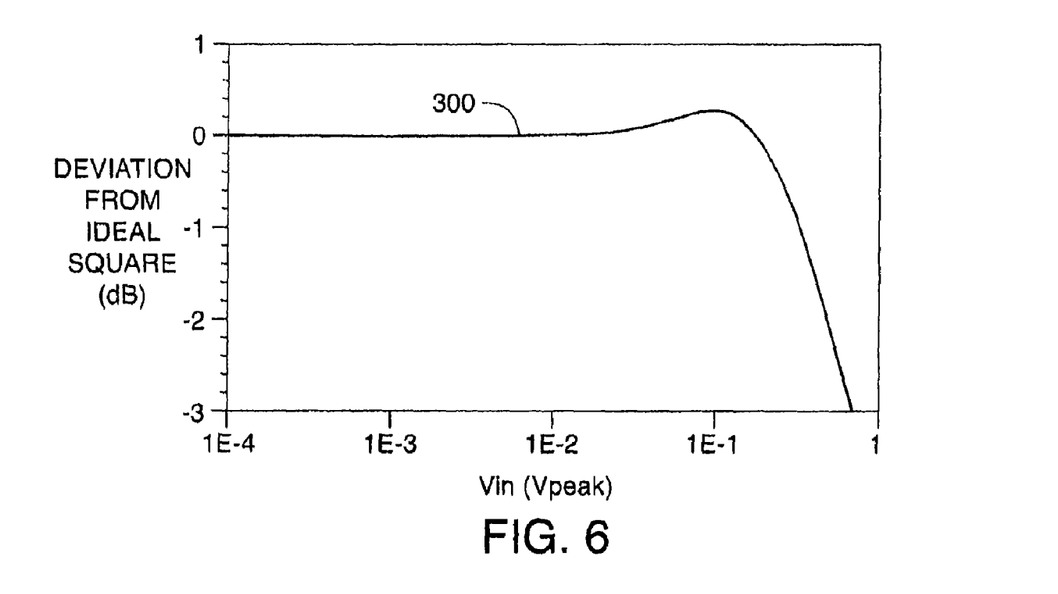
FIG. 6 is a graphical illustration of an example of deviation in time average output current from an ideal square.

FIG. 5 is a graphical illustration of an example of an implementation of the circuit arrangement shown in FIG. 3, showing the response curve 200 plotting the time averaged output current $I_{OUT}$ of the transconductance rectifier circuit arrangement in response to the input sinusoidal peak amplitude, compared to the ideal response 202 of the square of the input voltage in response to the same input. FIG. 6 shows the deviation plot 300 of curve 200 from ideal square curve 202 using the data shown in the FIG. 5 illustration. As can be seen the example, the circuit arrangement maintains square law conformance with a typical error of about ±0.5 dB up to an input amplitude of about 250 mV. By choosing an optimal bias point and emitter resistance value for resistors 66, 22 and 84 (in FIG. 3), the transition between the ideal square law and linear response is smoothed to give wider dynamic range.

Figure 7:
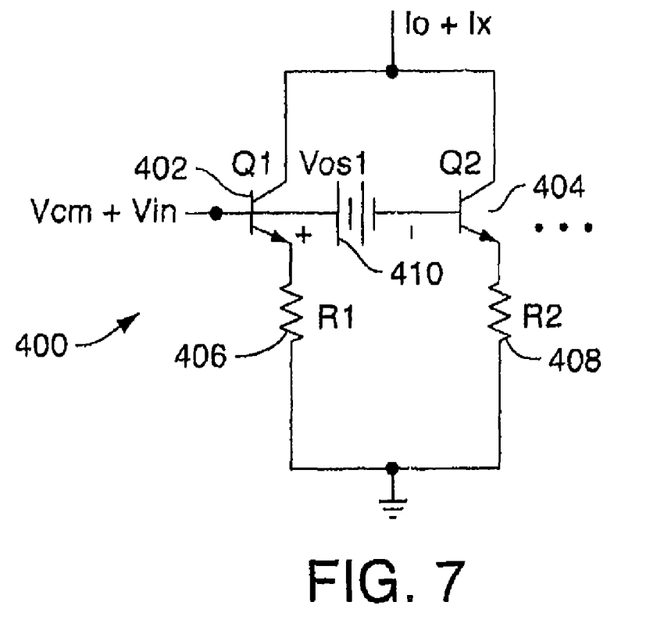
FIG. 7 is a schematic diagram of an example of a transconductance rectifier configuration having an extended range.
Figure 8:
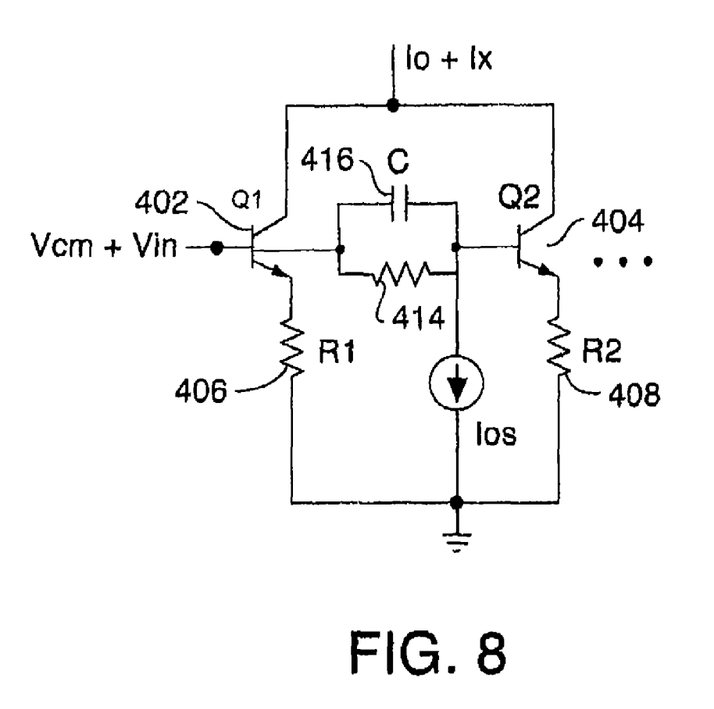
FIG. 8 is a schematic diagram of an embodiment of a transconductance rectifier with an extended range.
Figure 9:
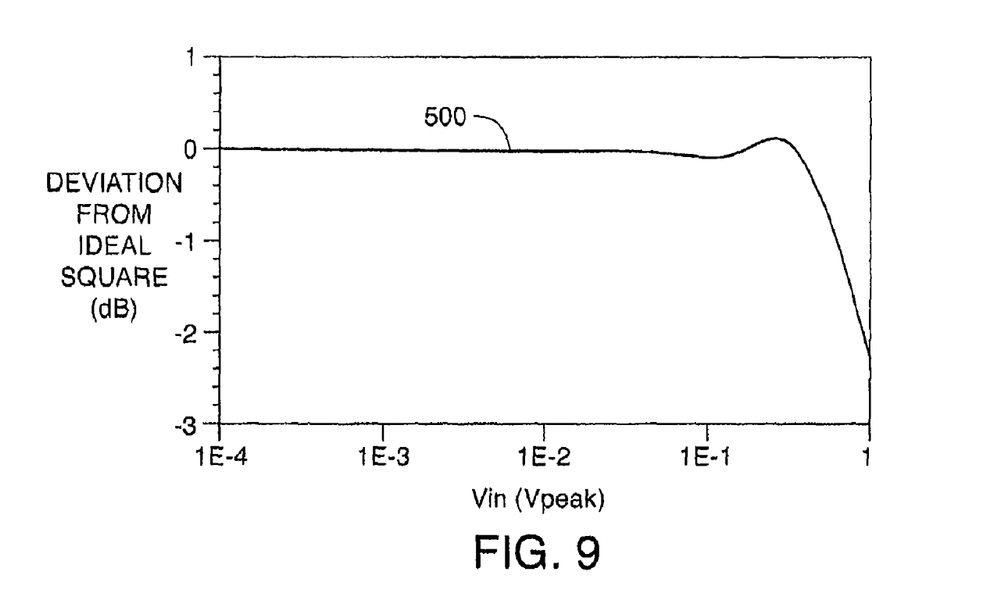
FIG. 9 is a schematic diagram of an example of deviation in time average output current from an ideal square for a transconductance rectifier having an extended range.
Figure 10:
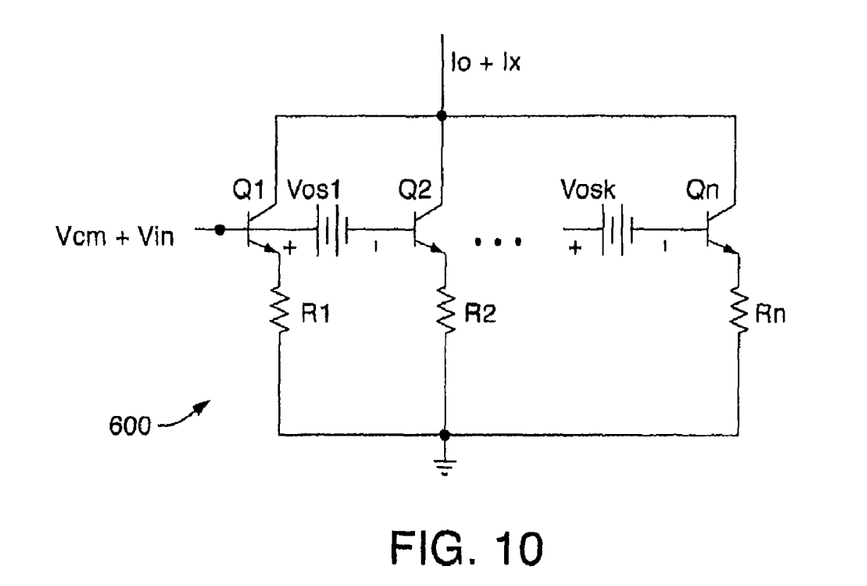
FIG. 10 is a schematic diagram of a transconductance rectifier having an extended range using n stages.

It is possible to extend the input range of the circuit arrangement by replacing each of the transistors 20 and 80 and the corresponding emitter resistors 22 and 84 with two or more transistor stages and an offset voltage source, such as shown in FIG. 7. Specifically, in FIG. 7, the transistor 402 and 404 and their corresponding emitter resistors 406 and 408, form a two stage arrangement 400 and would replace each of the transistors 20 and 80 and their corresponding emitter resistors 22 and 84. The offset voltage source 410 is used to place different Vcm voltages on each of the transistors of each stage so that transistor 20 operates in one range, and transistor 64 operates in a different range. The offset voltage source 410 can be realized as shown in FIG. 7 with a current source 412, Ios, and a parallel RC connection (indicated at 414 and 416) allowing for both a DC path and low-loss RF path to the second stage of each arrangement. It should be clear that any number of stages can be used with a separate offset Referring to FIG. 9, an example of a deviation curve 500 in time average output current of an arrangement using two stages for each leg of the rectifier arrangement in FIG. 8 shows that the circuit maintains square law performance with an error of ±0.5 dB up to an input amplitude of about 500 mV, showing a 6 dB improvement over the deviation curve 300 (shown in FIG. 6) of the single stage rectifier illustrated in FIG. 3. In principle this method of extending the input range can be accomplished with any number of transconductance rectifier stages having proper offset voltage sources and emitter degeneration resistors as illustrated at 600 in FIG. 10.

Figure 11:
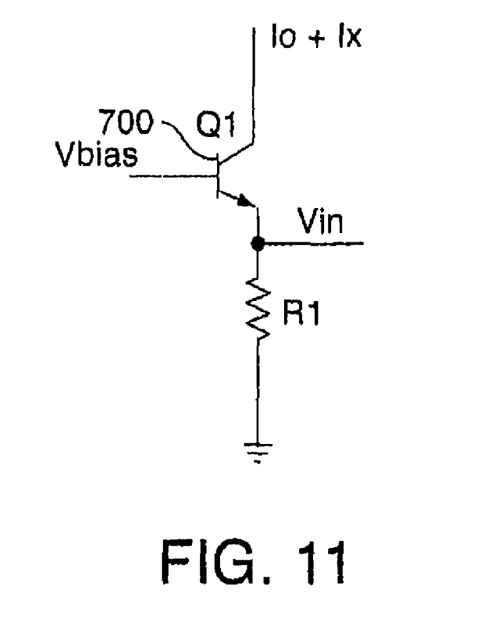
FIG. 11 is a schematic diagram of a common-base transconductance rectifier.

The input impedance of the rectifier circuit arrangement is very high and has a capacitive component from the base-emitter capacitance of the transistor used. It is possible to obtain a 50Ω input match to very high frequencies by using an equivalent shunt 50Ω resistance and a LC matching network to remove the base-emitter capacitive reactance. The input impedance is quite linear for the common-emitter rectifier circuit as shown in FIG. 2, typically achieving +16 dBm IIP3 ("third order intermodulation intercept point"). As shown in FIG. 11, it is also possible to substitute a common-base version of the rectifier for each of the transistors 44, 38, 20 and 60 of FIG. 2. As shown Vin is applied to the emitter of the rectifier 700. In practice, the input would have a DC blocking capacitor so as not to disturb the bias point of the transistor replacing transistor 20. One drawback of the common-base version is that the IIP3 is significantly lower at +2 dBm due to the non-linearity in the low emitter input impedance.

Figure 12:
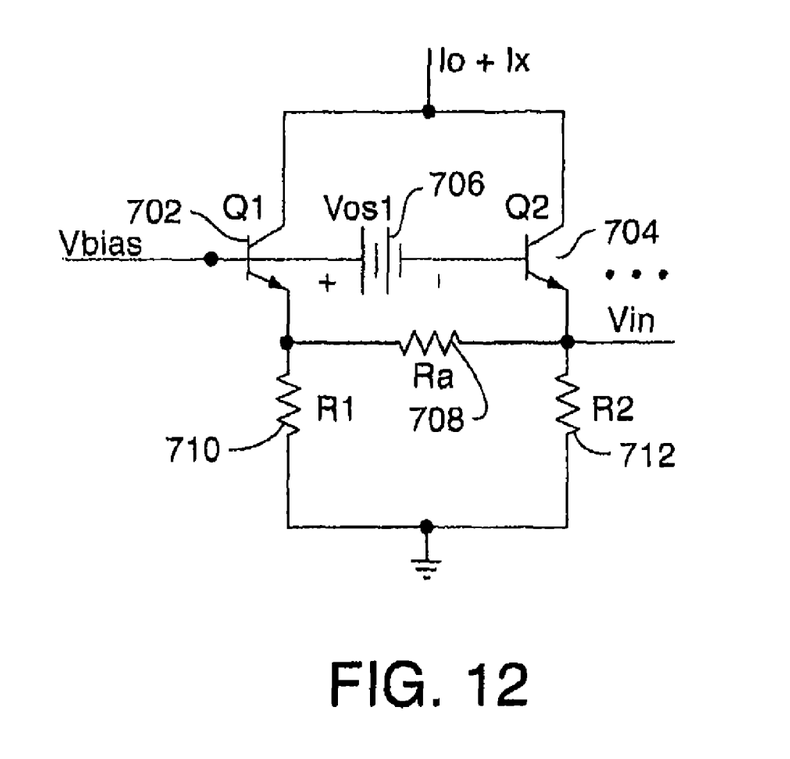
FIG. 12 is a schematic diagram of a common-base transconductance rectifier with an extended range.
Figure 13:
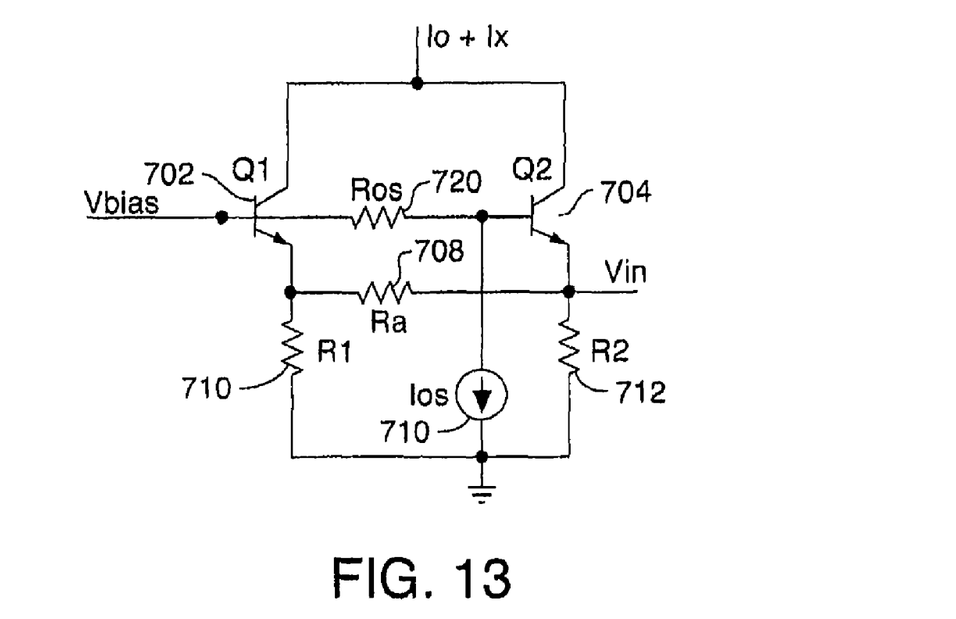
FIG. 13 is a schematic diagram of an extended range common-base transconductance rectifier implementation.
Figure 14:
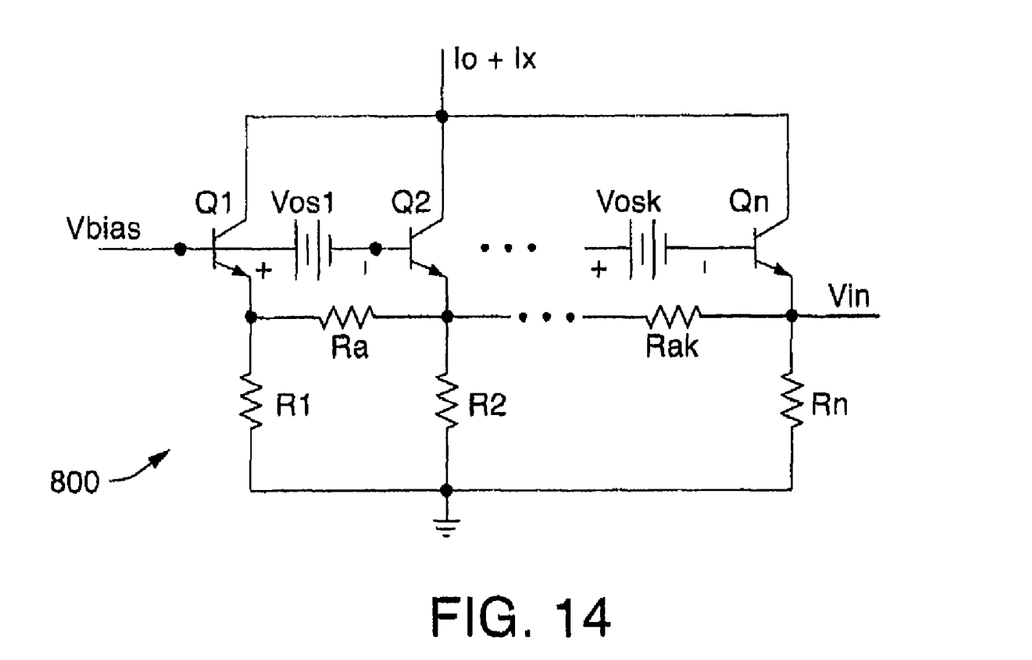
FIG. 14 is a schematic diagram of a multiple stage common-base transconductance rectifier.

Similar to the common-emitter transconductance rectifier arrangement with an extended range, the range of the common-base version can also be extended in a similar manner with two or more common-base transconductance rectifiers with appropriate offset voltage sources (one being shown at 706 in FIG. 12) replacing the transconductance rectifier of each leg referenced by the transistors 20 and 80 and corresponding emitter resistors 22 and 84 and in FIG. 3, respectfully. FIG. 11 illustrates a two stage common-base transconductance rectifier with extended range, including the transistors 702 and 704 he base of both. An attenuation resistor 708 is connected between the two emitters of the two transistors. The emitter attenuation resistors 710 and 712 and the attenuation resistor 708 are chosen to simultaneously provide a 50 ohm input impedance matching to high frequency and proper scaling of the output currents such that the total current retains square law conformance over an extended range. FIG. 13 shown an implementation of the FIG. 12 arrangement, in which the resistor 720 is connected between the bases of transistors 702 and 704, while a current source 722 is provided between the bases of transistors 702 and 704 and system ground. The arrangement 800 of more than two stages using the common-base arrangement is also possible as shown in FIG. 14.

Figure 15:
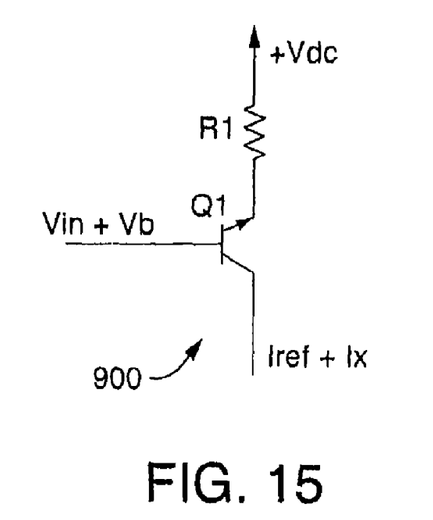
FIG. 15 is a schematic diagram of a PNP transconductance rectifier.
Figure 16:
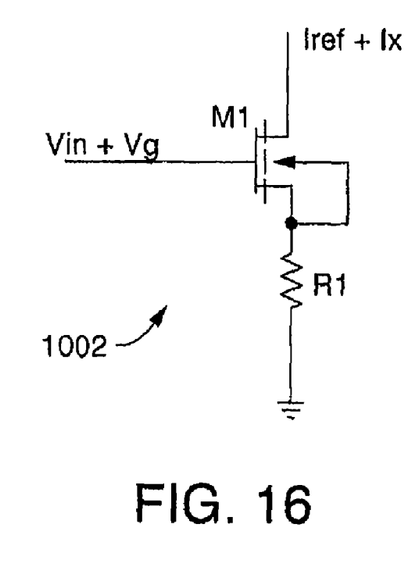
FIG. 16 is a schematic diagram of a PNP transconductance rectifier.
Figure 17:
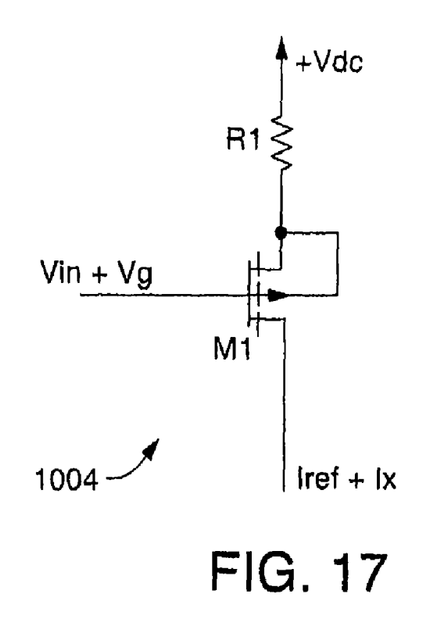
FIG. 17 is a schematic diagram of a P-Channel MOSFET transconductance rectifier.
Figure 18:
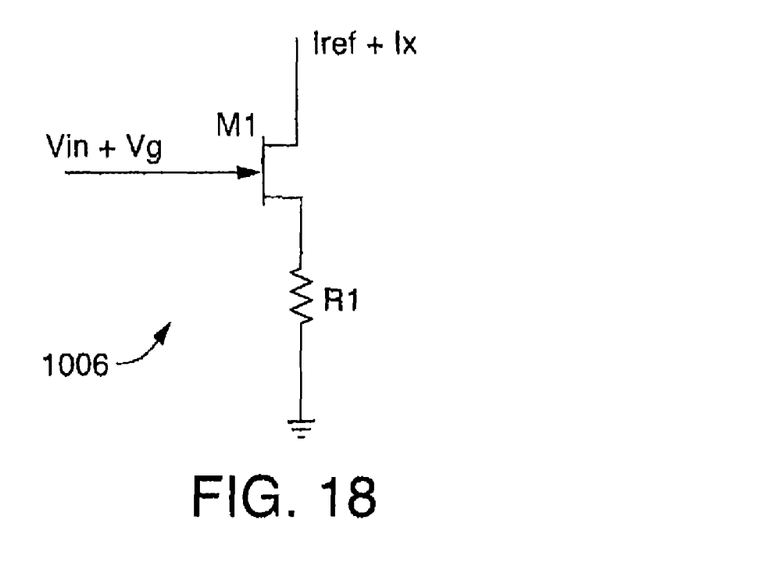
FIG. 18 is a schematic diagram of a N-Channel MOSFET transconductance rectifier.
Figure 19:
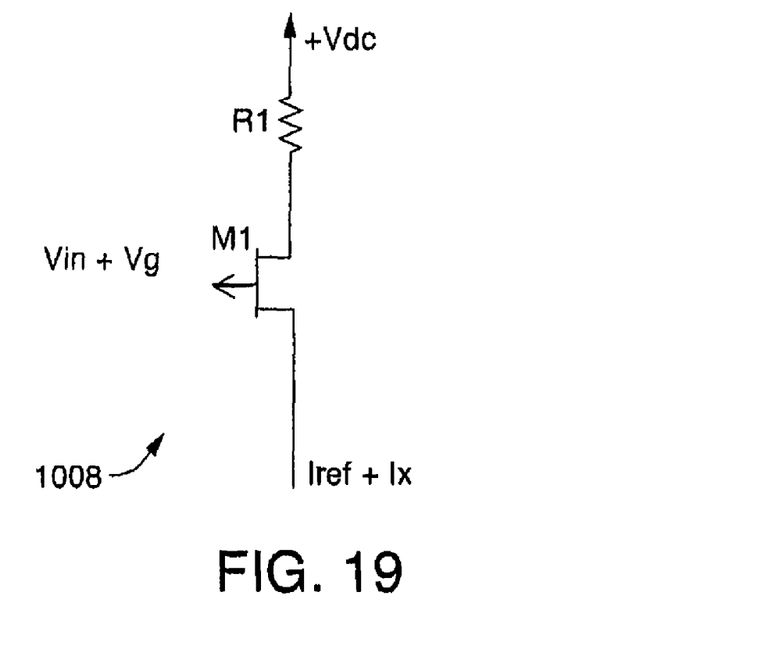
FIG. 19 is a schematic diagram of a P-Channel JFET or MESFET transconductance rectifier.

In principle the transconductance rectifier concept can be extended to other transistor types provided with proper biasing. FIG. 15 shows a PNP transistor used as a current sourcing transconductance rectifier arrangement 900. FIGS. 15-19 show the rectifier implemented with P and N channel enhancement MOSFET transistors 1002 and 1004, and P and N channel enhancement JFET or MESFET transistors 1006 and 1008, respectively. These devices have a roughly square-law dependence of the drain current with respect to the gate voltage and will thus produce a time averaged output current proportional to the square of the input gate voltage in like manner to the common-emitter and common-base rectifier arrangements. In addition, the transconductance rectifier arrangements using the other transistor types can be modified to extend the range of single stage arrangements for each leg, with two or more stages. It is clear to one skilled in the art that other transconductance devices can be substituted for each of the NPN transistors shown in FIG. 3 to obtain similar function including depletion-mode devices with appropriate biasing circuits.

The foregoing provides a power measurement circuit designed to provide a measurement of average power, and capable of operating with a low supply voltage, making it ideal for battery operated devices. A further advantage is that the circuit does not require a balun transformer when a single-ended input signal is applied to the input of the circuit. Further, the circuit does not require a true square of input voltage to calculate average power of the input, as for example required by the circuit described in the Gilbert Patent. In addition, the added emitter resistance improves the detection range of the circuit, while the use of multiple detection stages further increases the detection range.

Thus, system and as employed in the methods and systems described in the foregoing specification is constructed in accordance with the present invention. The exemplary embodiments described in this specification have been presented by way of illustration rather than limitation, and various modifications, combinations and substitutions may be effected by those skilled in the art without departure either in spirit or scope from this invention in its broader aspects and as set forth in the appended claims. The system and method as disclosed herein, and all elements thereof, are contained within the scope of at least one of the following claims. No elements of the presently disclosed method and system are meant to be disclaimed.

What is claimed is:

1. A single-ended, input power measurement circuit for measuring the power of a periodically varying input voltage signal having an approximate 50% duty cycle, the circuit comprising:
   a single-ended transconductance rectifier arrangement with square-law conformance, the rectifier arrangement including an input configured to receive the periodically varying input voltage signal; and
   an averaging filter coupled to the single-ended rectifier arrangement and arranged and configured to produce a time averaged DC output signal proportional to the mean square of the voltage at the input of the transconductance rectifier arrangement and representative of the average power of the input voltage signal within a range of voltages at the input.

2. A power measurement circuit according to claim 1, wherein the averaging filter includes a RC filter.

3. A power measurement circuit according to claim 1, wherein the averaging filter includes an RC filter for producing a time averaged DC output voltage signal as a function of the output current of the transconductance rectifier arrangement and representative of the average power of the input voltage signal within a range of input voltage signals.

4. A power measurement circuit according to claim 1, further including a DC bias impedance arrangement configured to apply a DC bias to the input of the transconductance rectifier arrangement and configured to prevent shorting of the periodically varying input voltage signal.

5. A power measurement circuit according to claim 1, wherein the transconductance rectifier arrangement includes a first rectifier element coupled to the averaging filter and configured so as to generate a first output voltage representing (a) the mean square voltage at the input of the transconductance rectifier arrangement and (b) a reference voltage, and a second rectifier element coupled to an impedance and configured so as to generate a second output voltage representing the reference voltage, the power measurement circuit further including an output for providing an output signal representing the mean square voltage as a function of the difference between the first output voltage and the second output voltage.

6. A power measurement circuit according to claim 5, further including (a) a current mirror including one transistor element arranged so as to generate a first reference current, and (b) at least one other transistor element forming the first rectifier element of the transconductance rectifier arrangement so that a reference current is generated through the first rectifier element that is directly proportional to the first reference current.

7. A power measurement circuit according to claim 5, wherein the first and second rectifier elements each form a first stage, and wherein the power measurement circuit further includes at least one additional rectifier element coupled to each of the first and second rectifier elements so that each forms a respective second stage so as to extend the range of input voltage signals in which the time average DC output signal is proportional to the mean square of the voltage at the input of the transconductance rectifier arrangement and representative of the average power of the input voltage signal.

8. A power measurement circuit according to claim 7, further including an offset voltage source coupled between each of the first rectifier and the second rectifier elements of the first stage on the one hand, and each of the corresponding rectifier elements of the second stage on the other hand.

9. A power measurement circuit according to claim 1, wherein the transconductance rectifier arrangement includes a common emitter transconductance rectifier.

10. A power measurement circuit according to claim 1, wherein the transconductance rectifier arrangement includes a common base transconductance rectifier.

11. A power measurement circuit according to claim 1, wherein the transconductance rectifier arrangement includes a npn transconductance rectifier.

12. A power measurement circuit according to claim 1, wherein the transconductance rectifier arrangement includes a pnp transconductance rectifier.

13. A power measurement circuit according to claim 1, wherein the transconductance rectifier arrangement includes a p-channel MOSFET transconductance rectifier.

14. A power measurement circuit according to claim 1, wherein the transconductance rectifier arrangement includes a n-channel MOSFET transconductance rectifier.

15. A power measurement circuit according to claim 1, wherein the transconductance rectifier arrangement includes a p-channel JFET transconductance rectifier.

16. A power measurement circuit according to claim 1, wherein the transconductance rectifier arrangement includes a n-channel JFET transconductance rectifier.

17. A power measurement circuit according to claim 1, wherein the transconductance rectifier arrangement includes a p-channel MESFET transconductance rectifier.

18. A power measurement circuit according to claim 1, wherein the transconductance rectifier arrangement includes a n-channel MESFET transconductance rectifier.

19. A method of measuring power of a periodically varying input voltage signal having an approximate 50% duty cycle with a circuit comprising a transconductance rectifier arrangement including a single-ended input configured to receive the periodically varying input voltage signal, the method comprising:
   producing a time averaged DC output signal proportional to the mean square of the periodically varying input voltage signal at the input of the transconductance rectifier arrangement so that the time averaged DC output signal is representative of the average power of the input voltage signal within a range of voltages at the input.

* * * * *